United States Patent [19]
Inoue

[11] Patent Number: 5,963,488
[45] Date of Patent: Oct. 5, 1999

[54] SEMICONDUCTOR MEMORY DEVICE

[75] Inventor: Koji Inoue, Ikoma, Japan

[73] Assignee: Sharp Kabushiki Kaisha, Osaka, Japan

[21] Appl. No.: 09/035,113

[22] Filed: Mar. 4, 1998

[30] Foreign Application Priority Data

Mar. 7, 1997 [JP] Japan .................................. 9-053656

[51] Int. Cl.⁶ .................................................. G11C 7/00
[52] U.S. Cl. ................................................... 365/200
[58] Field of Search .......................... 365/200, 238.5, 365/201

[56] References Cited

U.S. PATENT DOCUMENTS

| | | | |
|---|---|---|---|
| 5,134,583 | 7/1992 | Matsuo et al. | 365/200 |
| 5,243,570 | 9/1993 | Saruwatari | 365/201 |
| 5,357,473 | 10/1994 | Mizuno et al. | 365/200 |
| 5,373,471 | 12/1994 | Saeki et al. | 365/200 |
| 5,452,258 | 9/1995 | Hotta . | |
| 5,475,648 | 12/1995 | Fujiwara | 365/200 |
| 5,550,394 | 8/1996 | Sukegawa et al. | 365/200 |
| 5,619,473 | 4/1997 | Hotta . | |

*Primary Examiner*—David Nelms
*Assistant Examiner*—Anh Phung
*Attorney, Agent, or Firm*—Morrison & Foerster LLP

[57] ABSTRACT

The semiconductor memory device is provided with a readout mode in which a plurality of word data are read out from a memory cell array as a group and are subjected to a time division operation to be continuously output. The device includes a redundant unit which replaces a bit data of a defective bit present in the respective word data with a replacement data on a basis of the word data during said readout mode, thereby reconfiguring the plurality of word data.

4 Claims, 12 Drawing Sheets

Redundant circuit

SEMICONDUCTOR MEMORY DEVICE

BACKGROUND OF THE INVENTION

1. Field of the Invention

The present invention relates to a semiconductor memory device such as a read-only memory equipped with a redundant circuit.

2. Description of the Related Art

Recently, as the operation of the microprocessor has become faster, faster-operating semiconductor memory devices have been strongly demanded. A semiconductor memory device realizing faster usual random access and further having a high-speed readout mode, referred to as the "page mode", "burst mode", "serial mode", etc., with respect to continuous addresses, is now being developed, as described in, for example, Japanese Laid-open Publication No. 8-63990, which corresponds to U.S. Pat. No. 5,619,473.

For example, in the page-mode readout operation, a plurality of memory cells in a memory cell array are simultaneously selected in accordance with a column address and a row address of an input address, and a plurality of data are read out from the selected plurality of memory cells to a sense amplifier as page data. The addresses in the page are then changed under this condition, whereby the data of the selected plurality of memory cells are successively output at a high speed.

Referring to FIG. 9, a read-only memory (hereinafter, referred to as a "ROM") having a page-mode function will be described.

A ROM 200 has 16 Mbits of storage capacity. In the ROM 200, column addresses A0 to A6 and row addresses A7 to A19 are input, and 16-bit data D0 to D15 are output. One page includes four (4) words (i.e., 16 bits×4).

Pages are specified by the addresses A2 to A19, and word data in each page is accessed by the addresses A0 and A1. Hereinafter, for clarity, the addresses A0 and A1 will be referred to as "intra-page addresses", and the addresses A2 to A19 will be referred to as "page addresses".

Furthermore, the ROM 200 is equipped with memory cell arrays MA0 to MA15 in which memory cells are arranged in a matrix, and bit data corresponding to each bit of 16-bit output data D0 to D15 is stored in each memory cell array.

The ROM 200 further includes address buffers AB7 to AB19, a pre-row decoder PRD, and a row decoder XDEC, as a row selection unit for selecting memory cells in the rows corresponding to the row addresses A7 to A19. The ROM 200 also includes address buffers AB2 to AB6, a pre-column decoder PCD, and column decoders YDEC, as a column selection unit for selecting memory cells in the columns corresponding to the column addresses A2 to A6.

The column decoders YDEC are provided for the respective memory cell arrays MA0 to MA15 so as to simultaneously select four (4) columns of bit lines in accordance with the addresses A2 to A6. In the subsequent stage of each column decoder YDEC, four sense amplifiers SA0 to SA3 are provided, which detect and amplify bit signals forming one page appearing in selected four bit lines in a parallel manner.

Furthermore, the ROM 200 includes address buffers AB0 and AB1, a page mode decoder PMD, and a selector SEL, as a word data selection unit for selecting the word data corresponding to the intra-page addresses A0 and A1. The selector SEL alternatively selects outputs DOS0 to DOS3 of the sense amplifiers SA0 to SA3 in response to signals P0 to P3 from the page mode decoder PMD. Furthermore, in the subsequent stage of the selector SEL, an output circuit OB is provided for generating the output from either one of the selected sense amplifiers as output data D0 (to D15).

In the memory cell arrays MA0 to MA15 of the ROM 200, bit lines are arranged hierarchically, as shown in FIG. 10. More specifically, in FIG. 10, sub-bit lines (e.g., SB0, SB1) of the respective memory cell arrays are connected to sources and drains of a set of adjacent memory cells, whereby a predetermined plurality of memory cells in the identical column are commonly connected.

Furthermore, main bit lines (e.g., MB0, MB1) are connected to the sub-bit lines (SB0, SB1) through selection transistors (TB0, TB1) and arranged in the memory cell array so as to be orthogonal to word lines. Gates of the selection transistors (TB0, TB1) are connected to selection signal lines (BS0, BS1) arranged in parallel with the word lines so as to select the sub-bit lines (SB0, SB1).

Furthermore, as shown in FIG. 10, the column decoder YDEC includes 128 column selection MOS transistors, with 32 column selection MOS transistors TG0 to TG31 being one unit. One end of the column decoder YDEC is connected to each bit line of the memory cell array, and the other end is commonly connected to the sense amplifiers SA0 to SA3. When one of column selection signals CS0 to CS31 becomes active, four out of 128 column selection MOS transistors are brought into conduction, whereby four out of 128 bit lines of the memory cell array are simultaneously selected. As a result, data DOB0 to DOB3 from four memory cells of each memory cell array simultaneously appear in the outputs of the column decoder YDEC. The sum of the outputs of 16 column decoders of each memory cell array corresponds to one page of data.

Next, a page-mode operation of a circuit shown in FIGS. 9 and 10 will be described with reference to a timing diagram shown in FIG. 11.

First, when the addresses A0 to A19 are determined at time t0, the first word of data of a page $P_h$ specified by the page addresses A2 to A19 is read out. Such a readout of the first data is usually conducted in the same way as in a random access mode as described below.

When the row addresses A7 to A19 are determined at time t0, one word line passing through the memory cell arrays MA0 to MA15 is activated (become high-level) by the above-mentioned row selection unit. On the other hand, when the column addresses A2 to A6 are determined at time t0, either one of the column selection signals CS0 to CS31 is activated by the above-mentioned column selection unit. Then, four column selection MOS transistors in the column decoder YDEC, which have received the activated column selection signals, are simultaneously turned on, whereby four bit lines connected to these column selection MOS transistors are selected.

Next, data signals of four memory cells positioned at crossed points of four selected bit lines and one activated word line are respectively input to the sense amplifiers SA0 to SA3 through the column decoder YDEC, and the outputs DOS0 to DOS3 of the respective sense amplifiers SA0 to SA3 are determined at time t1. Thus, one page of word data specified by the page addresses A2 to A19 is prepared.

Then, one of the signals P0 to P3 from the page mode decoder PMD becomes active in accordance with the intra-page addresses A0 and A1. One of the outputs DOS0 to DOS3 of the sense amplifiers is thus selected by the selector SEL, and the first word data W0 (D0 to D15) of the page $P_h$ is output at time t2. When the intra-page addresses A0 and A1 are changed at time t3, the selector SEL changes its selection of the sense amplifier outputs, and an output circuit OB outputs a second word W1 of the page $P_h$ at time t4. Thereafter, the intra-page addresses A0 and A1 are successively changed in a similar manner, and the third word W2 and the fourth word W3 are successively output.

Next, in the case where the page addresses A2 to A19 are changed and the subsequent page $P_{h+1}$ is accessed, only the first word of the page $P_{h+1}$ is accessed in the same way as in a random access mode. Thereafter, other words of the page $P_{h+1}$ are read out at a high speed in accordance with the intra-page addresses A0 and A1. In the case of reading out the second word W1 to the fourth word W3, the selector SEL selects and outputs data DOB1 to DOB3 which have been previously read out at the same time as the readout of the first word and prepared for the outputs of the sense amplifiers SA1 to SA3. Therefore, compared with a random access in which a weak data signal is read out and output from a memory cell at each access, output data can be determined in a short period of time, making it possible to read out data at a high speed.

Hereinafter, a typical conventional replacement operation (in other words, a compensation operation) for a defective bit will be explained.

As disclosed, for example, in Japanese Laid-open Publication No. 6-76591, which corresponds to U.S. Pat. No. 5,452,258, in order to improve the production yield of a ROM such as a mask ROM, there is provided a ROM equipped with a redundant circuit for compensating for a defective bit. FIG. 12 is a block diagram for illustrating the exemplary configuration of such a ROM.

A ROM 200A in FIG. 12 includes a redundant circuit RDN which compensates for a defective bit contained in the data read out from a memory array.

The redundant circuit RDN includes: a detecting unit (or a replacement bank address storage portion) A for storing an address at which a defective bit is present and detecting an access to such a stored address; a replacement bit storage portion C for storing output bit position information of the defective bit and outputting such a stored information based on the detection result of the replacement bank address storage portion A; and, a replacement cell data storage portion B for storing a replacement data and outputting the stored replacement data based on the detection result.

Hereinafter, the replacement of a defective bit with the redundant circuit RDN will be described.

First, an address at which a detective bit is present and a bit position of the defective bit in the output data D0 to D15 (or output bit position information) are previously determined, for example, by a probing test using a memory tester. During the data readout operation, when the replacement bank address storage portion A detects a defective address, the replacement bit storage portion C and the replacement cell data storage portion B output, respectively, the output bit position information RD0 to RD15 and the replacement data RDAT.

On the other hand, data read out from a memory cell array specified by the defective address is detected and amplified by a sense amplifier AMP to be given to a switch ST. The switch ST selects the replacement data RDAT from the replacement cell data storage portion B and outputs it as the output data D0 (to D15) through the output circuit OB, based on the output bit position information RD0 to RD15 from the replacement bit storage portion C. Thus, the data from the defective bit is replaced with the replacement data, thereby compensating for the defect.

In a memory cell array including the above-mentioned hierarchically arranged bit lines, if one defective bit exists, data is prevented from being read out from the other memory cells connected to the same sub-bit line together with the defective bit. Therefore, replacement is conducted on the basis of a memory cell group (hereinafter, referred to as a "bank", i.e., a group of memory cells surrounded by a broken line in FIG. 12) connected to the same sub-bit line, whereby a redundant circuit can be efficiently constructed. In the example shown in FIG. 12, the bank is specified by the column addresses A0 to A6 and the row addresses A11 to A19 (hereinafter, referred to as a "bank address").

Hereinafter, a method for compensating for a defect in a mask ROM including hierarchically arranged memory cell arrays MA0 to MA15 composed of the above-mentioned banks will be briefly described.

First, a bank address, at which a defective bit is present, and output bit position information are previously specified, for example, by a probing test using a memory tester. The bank address at which the defective bit is present is stored in the replacement bank address storage portion A, the output bit position information of the defective bit is stored in the replacement bit storage portion C, and the replacement data of the bank is stored in the replacement cell data storage portion B, whereby the redundant circuit RDN is programmed.

In the case where the redundant circuit RDN is programmed as described above, when a supplied address matches the bank address stored in the replacement bank address storage portion A, a replacement data RDAT of a memory cell corresponding to a word line which becomes active is read out of the replacement cell data storage portion B. Thus, bit data MDAT0 to MDAT15 from the memory cell array specified by the output bit position information RD0 to RD15 from the replacement bit storage portion C are replaced with the replacement data RDAT.

In the above explanation, the mask ROM having a NOR-type cell array structure has been described. Alternatively, the similar replacement can be conducted even in the mask ROM having an NAND-type cell array structure on the basis of a series of memory cell groups.

However, in the case where a defective bit is compensated for in the above-mentioned conventional semiconductor memory device, the time required for a series of operations of the redundant circuit RDN tends to become long, and the readout time of the replacement data becomes longer than the access time in a page-mode. Therefore, when the redundant circuit RDN is operated in a page mode, the access time in a page-mode becomes longer.

Furthermore, in the case where a defective bit is compensated for by operating the redundant circuit RDN only when a page is changed (at this time, the access time becomes longer as in the usual random access) for the purpose of avoiding adverse influences of the operation of the redundant circuit RDN, all the words contained in one page will have to be replaced. This remarkably increases the size of the redundant circuit, and makes it difficult to replace many bits, resulting in making it difficult to effectively perform the replacement operation.

SUMMARY OF THE INVENTION

The semiconductor memory device of the present invention is provided with a readout mode in which a plurality of word data are read out from a memory cell array as a group and are subjected to a time division operation to be continuously output. The device includes a redundant unit which replaces a bit data of a defective bit present in the respective word data with a replacement data on a basis of the word data during said readout mode, thereby reconfiguring the plurality of word data.

In one embodiment, the above-mentioned readout mode is a page-mode in which a plurality of word data corresponding to one page is read out from the memory cell array. In such a case, the device may include, as the redundant unit, a plurality of redundant circuits, provided so as to respectively correspond to the plurality of word data, for compensating for the defective bit present in the respective word data. Each of the redundant circuits may include: a detection portion for storing page address information of the defective bit and detecting an access to a page on which the defective bit is present; a bit information storage portion for storing output bit position information of the defective bit and outputting the stored output bit position information based on a detection result of the detection portion; and a replacement data storage portion for storing a replacement data and outputting the stored replacement data based on the detection result of the detection portion. The bit data of the defective bit specified by the output bit position information is replaced with the replacement data during the page mode, thereby reconfiguring the plurality of word data.

The device may further include: a group of sense amplifiers for detecting respective bit data at the same bit position of the plurality of word data in a parallel manner; and a unit for replacing the bit data of the defective bit of the respective word data specified by the output bit position information with the replacement data in a parallel manner, thereby reconfiguring the plurality of word data and outputting the reconfigured word data to the group of sense amplifiers, the unit being provided in a preceding stage to the group of sense amplifiers.

Alternatively, the device may further include: a sense amplifier for time-dividing respective bit data at the same bit position of the plurality of word data and continuously detecting the bit data; and a unit for replacing the bit data of the defective bit of the word data specified by the output bit position information and intra-page address information, thereby reconfiguring the plurality of word data, the unit being provided in a subsequent stage to the sense amplifier.

The replacement data storage portion may store the replacement data on a basis of bank data to be stored in a plurality of memory cells forming one bank.

Hereinafter, the function of the present invention will be described.

According to a semiconductor memory device of the present invention, a redundant circuit replaces bit data of a defective bit with a replacement data for a plurality of word data, constituting a group, previously read out from a memory cell array on the basis of word data, thereby reconfiguring a plurality of word data. Then, a plurality of the reconfigured word data are subjected to a time division operation in accordance with an address specifying the inside of a page to be continuously output.

Alternatively, it may be possible that when a detection portion forming a redundant circuit detects an access to a page including a defective bit, a bit information storage portion outputs the output bit position information of the defective bit, and the replacement data storage portion outputs the replacement data. The defective bit is replaced with the replacement data in accordance with the output bit position information, for a plurality of word data previously read out from a memory cell array on the basis of word data forming one page, thereby reconfiguring a plurality of word data. Then, a plurality of the reconfigured word data are subjected to a time division operation in accordance with an address specifying the inside of the page to be continuously output.

Furthermore, it may be possible that the defective bit of the respective word data specified by the output bit position information is replaced with the replacement data in a parallel manner, whereby a plurality of word data are reconfigured. Thereafter, the reconfigured word data are output to a sense amplifier group. The sense amplifier group detects and amplifies the respective bit data of a plurality of word data in a parallel manner. Then, a plurality of the detected and amplified word data are subjected to a time division operation in accordance with an address specifying the inside of a page to be continuously output.

One page of a plurality of word data which has already been read out may be selected to be detected and amplified by a sense amplifier. The detected and amplified bit data is replaced with the replacement data based on the output bit position information, thereby reconfiguring a plurality of word data.

A replacement data storage portion may store the replacement data on the basis of one bank, and replaces a defective bit of a memory cell array on the basis of the bank. In such a case, replacement can be conducted so that the defective bit is compensated for on the basis of a smallest unit (in which memory cells are directly connected to each other through bit lines).

Thus, the invention described herein makes possible the advantage of providing a semiconductor memory device in which a defective bit in a memory cell array including hierarchically arranged bit lines can be effectively compensated for, without sacrificing an access time in a high-speed readout mode such as a page-mode.

This and other advantages of the present invention will become apparent to those skilled in the art upon reading and understanding the following detailed description with reference to the accompanying figures.

DESCRIPTION OF THE PREFERRED EMBODIMENTS

Figure 1:
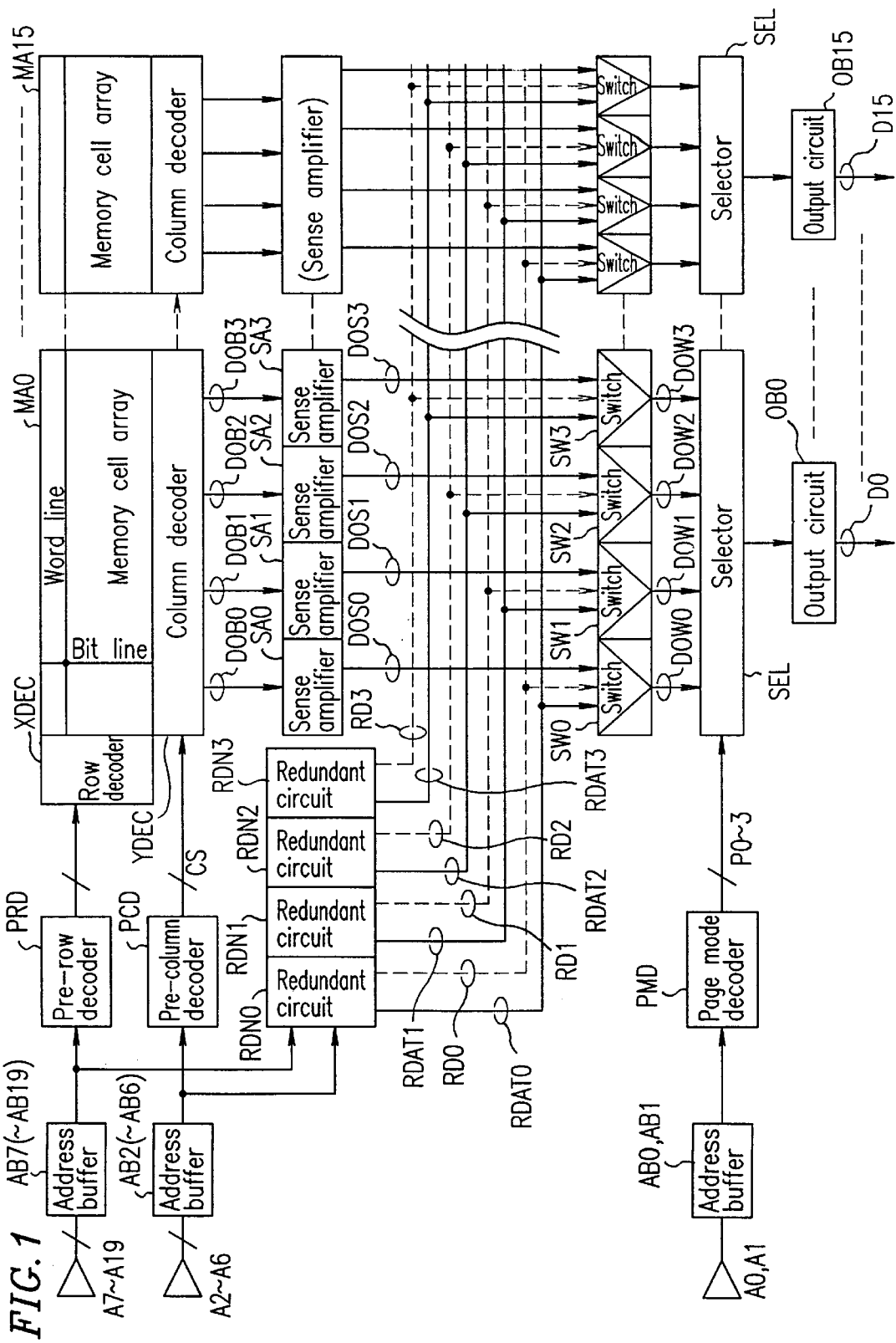
FIG. 1 is a block diagram of a semiconductor memory device of a first embodiment according to the present invention.

Hereinafter, the present invention will be described by way of illustrative embodiments with the reference to the drawings.

It should be noted that like reference numerals refer to like parts throughout the drawings, and redundant descriptions for the same or similar components will be omitted. Furthermore, in the following description, the subscript "m" included in each symbol indicates the positional arrangement in a memory cell array (i.e., a bit number in the output data), and the subscript "n" refers to bit lines which are simultaneously selected from a memory cell array MAm (i.e., the number of words in one page).

Embodiment 1

Figure 9:
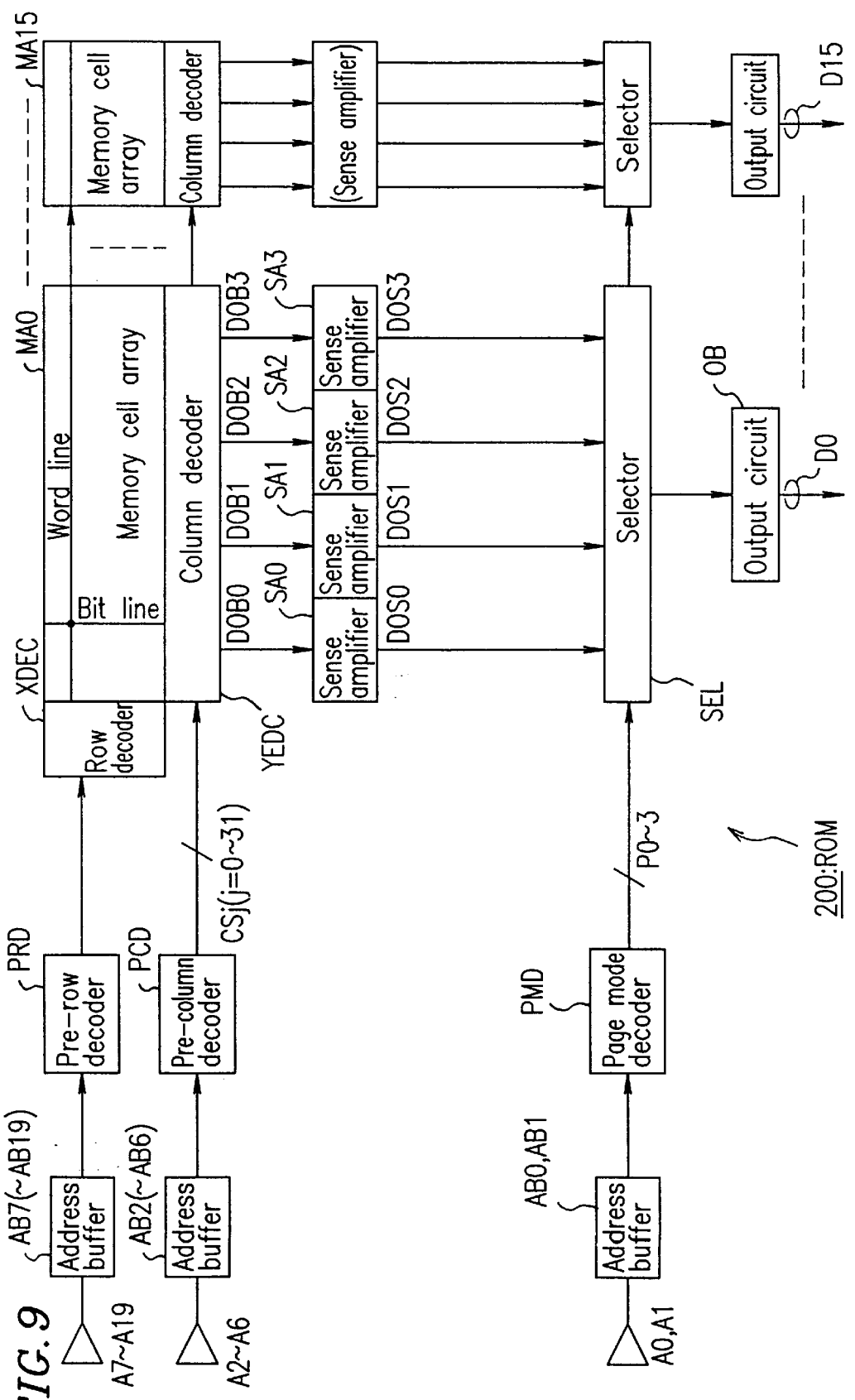
FIG. 9 is a block diagram of a semiconductor memory device provided with a page-mode.
Figure 10:
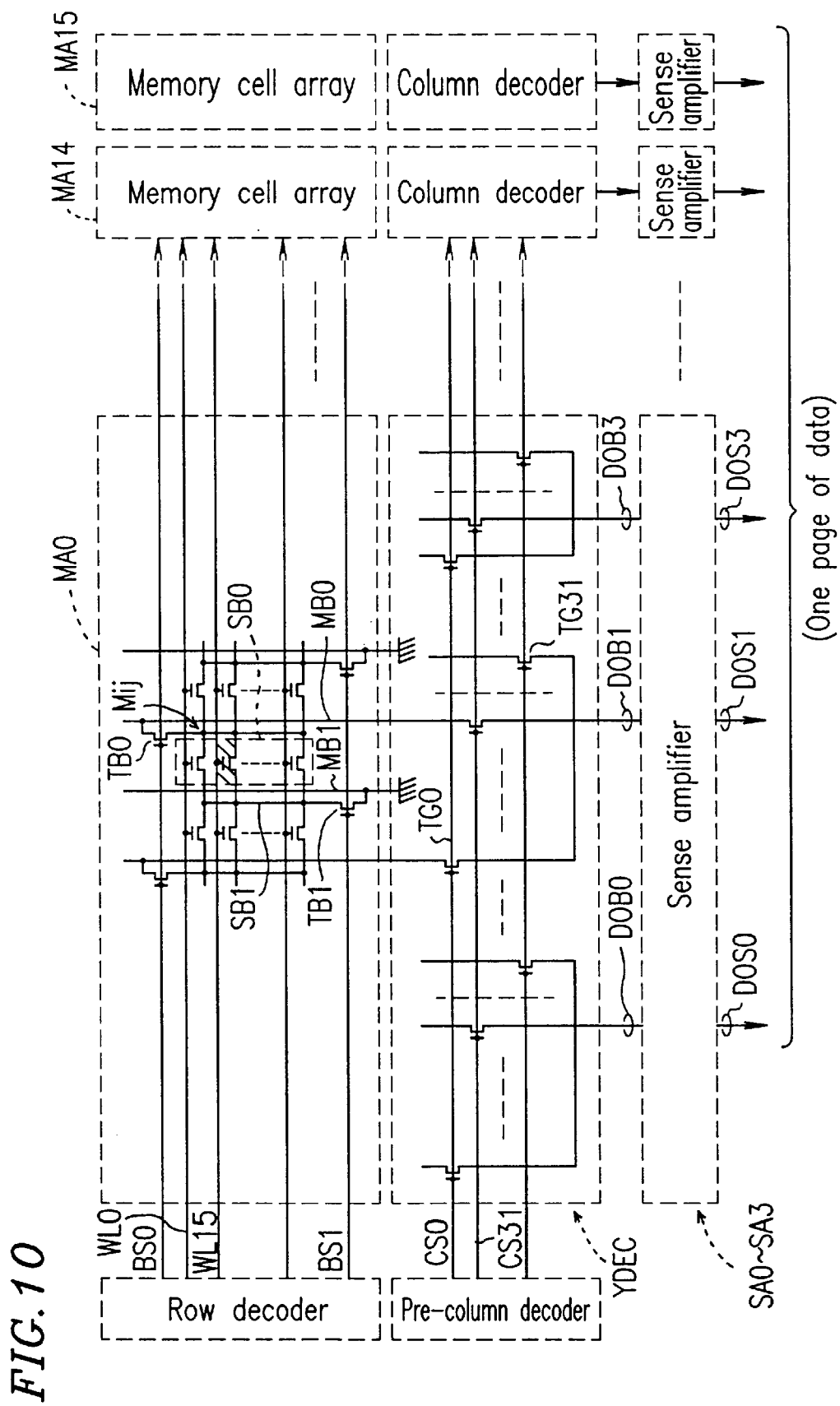
FIG. 10 is a circuit diagram in the periphery of a memory array in the semiconductor memory device provided with a page-mode.
Figure 11:
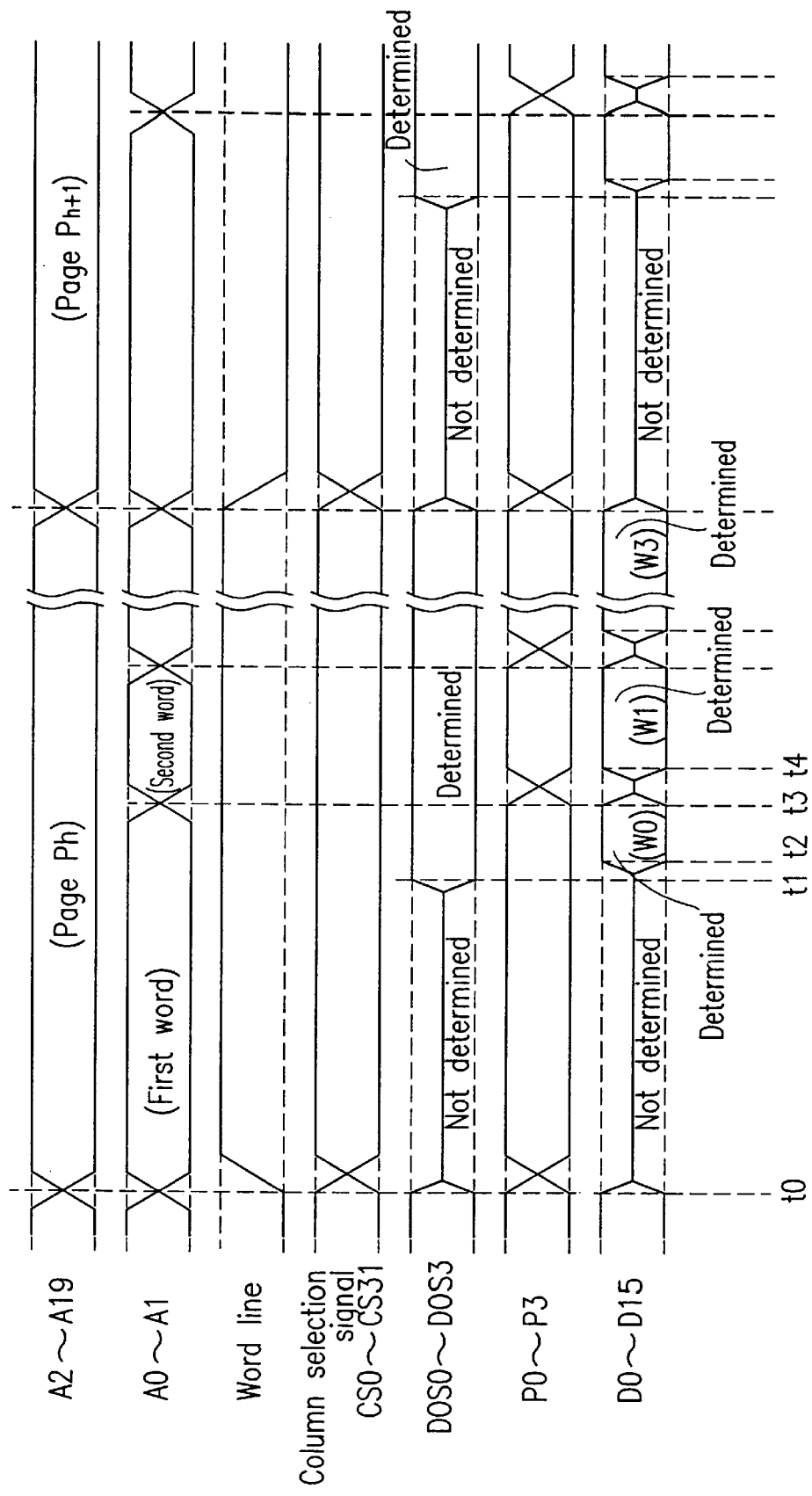
FIG. 11 is a timing diagram illustrating the operation of the semiconductor memory device in a page-mode.

A semiconductor memory device shown in FIG. 1 includes, in addition to the previously-mentioned structure as shown in FIG. 9, four (4) redundant circuits RDNn (n=0 to 3, likewise below) for compensating for a defective bit present in each of four (4) words of data included in one page, and switches SWn for replacing output data DmSn from each sense amplifier SAn with replacement data RDATn output from the redundant circuit RDNn for each memory array MAm (m=0 to 15, likewise below).

Figure 12:
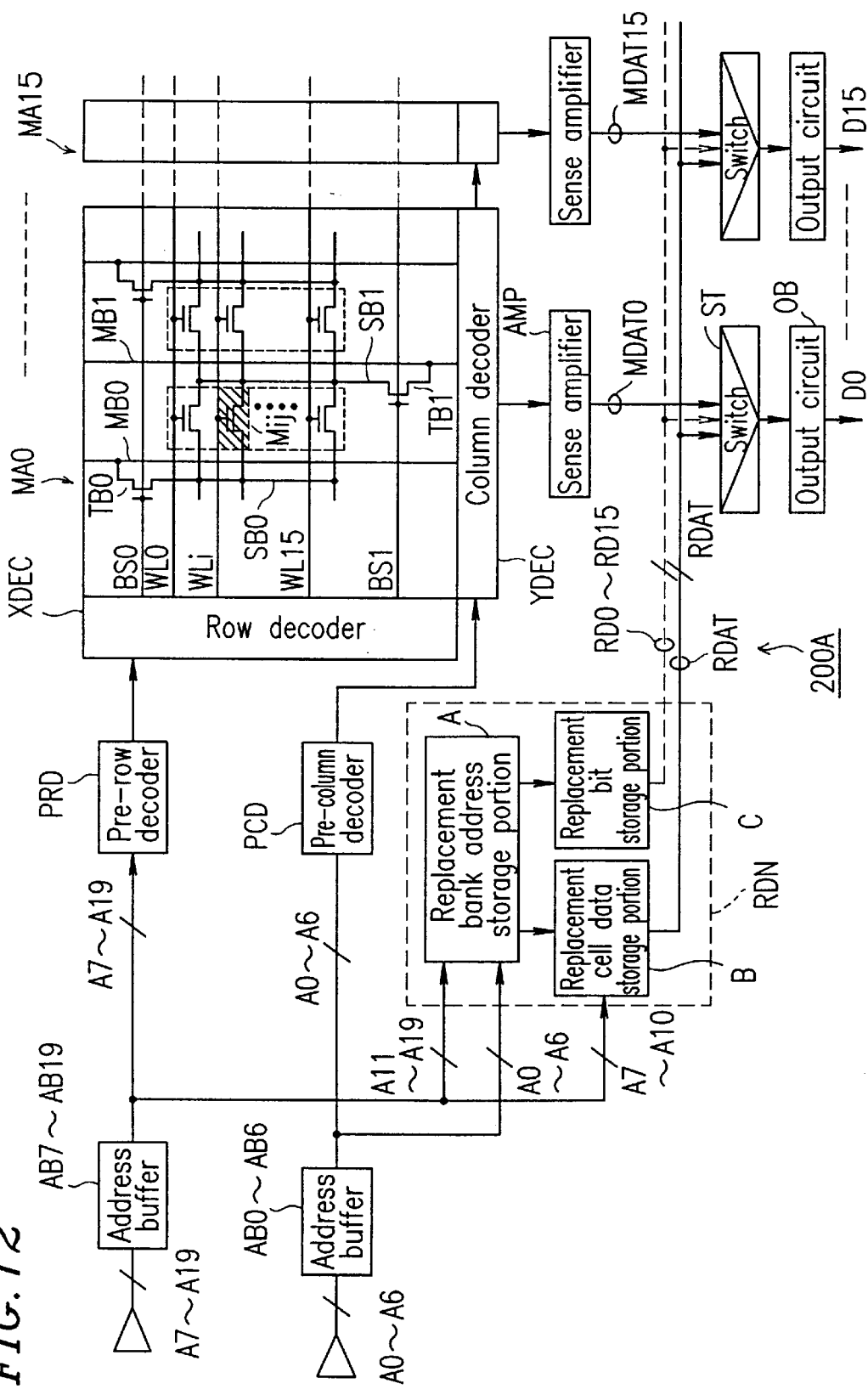
FIG. 12 is a block diagram of a conventional semiconductor memory device provided with a redundant circuit.

The memory cell array MAm in the semiconductor memory device of the present embodiment has hierarchically arranged bit lines in the same way as in FIG. 12, and is divided into banks on the basis of a memory cell group commonly connected to a sub-bit line. Each bank is specified by a bank address, and the bank address includes page addresses A2 to A6 and A11 to A19, and intra-page addresses A0 and A1. The relationship between the page and the bank will be described later.

Figure 2:
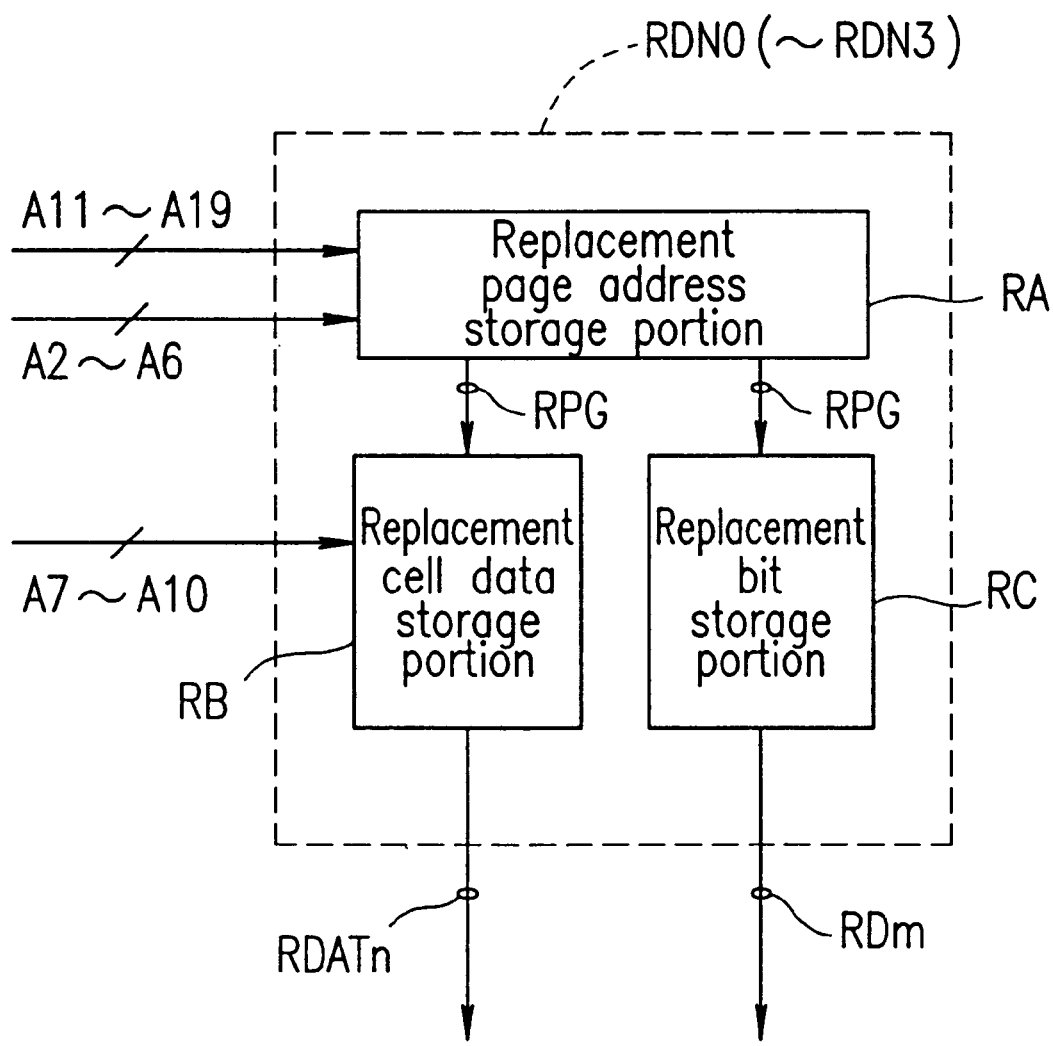
FIG. 2 is a block diagram of a redundant circuit provided in the semiconductor memory device of the first embodiment according to the present invention.

The redundant circuits RDNn shown in FIG. 1 are respectively provided for the first word data to the fourth word data contained in one page. As shown in FIG. 2, each of the redundant circuits RDNn includes: a replacement page address storage portion RA for storing a defective page address at which a defective bit is present and detecting an access to the defective page address from the addresses A2 to A6, and A11 to A19 to output replacement page specifying information RPG; a replacement cell data storage portion RB for storing a replacement data on the basis of a bank in which the defective bit is present and outputting a replacement data RDATn specified by the addresses A7 to A10 based on the detection result; and, a replacement bit storage portion RC for storing output bit position information RDm specifying a position of the defective bit in the 16-bit output data D0 to D15 and outputting the output bit position information RDm based on the detection result of the replacement page address storage portion RA.

Figure 3A:
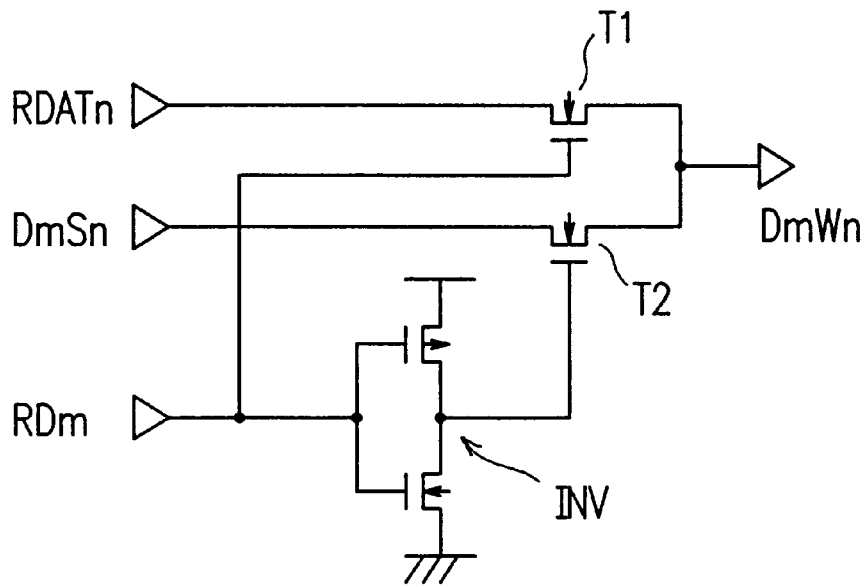
FIG. 3A is a circuit diagram of a switch circuit provided in the semiconductor memory device of the first embodiment according to the present invention.

In the case where the specified page of the input address matches the defective page address stored in the replacement page address storage portion RA, the switch SWn shown in FIG. 1 replaces the page data DmSn output from the sense amplifier SAn with the replacement data RDATn in accordance with the output bit position information RDm from the redundant circuit RDNn. Referring to FIG. 3A, the switch SWn includes an inverter INV for inverting output bit position information RDm, a transistor T1 for receiving the output bit position information RDm at its gate, and a transistor T2 for receiving an inverted signal of the output bit position information RDm at its gate. One end of the transistor T1 receives a replacement data RDATn and one end of the transistor T2 receives a sense amplifier output DmSn. The other ends of the transistors T1 and T2 are commonly connected to form an output portion.

Figure 3B:
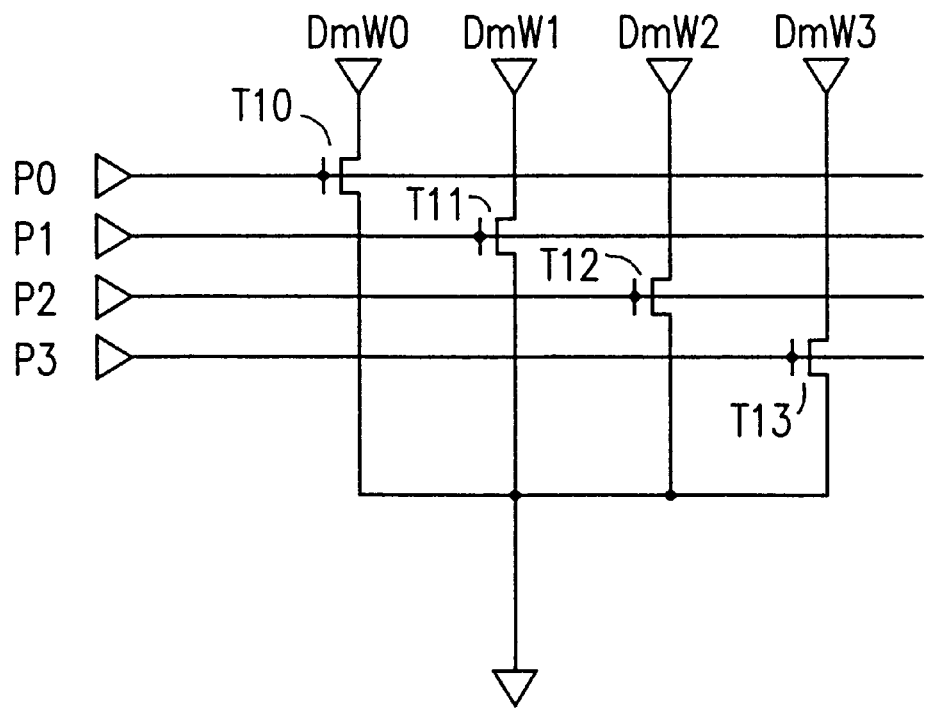
FIG. 3B is a circuit diagram of a selector provided in the semiconductor memory device of the first embodiment according to the present invention.

The transistors T1 and T2 conduct in a complementary manner based on the output bit position information RDm. When the output bit position information RDm is "1", the transistors T1 and T2 transmit the replacement data RDATn as data DmWn. When the output bit position information RDm is "0", the transistors T1 and T2 transmit the sense amplifier output DmSn as the data DmWn. Furthermore, referring to FIG. 3B, the selector SEL shown in FIG. 1 is configured using transistors T10 to T13 which alternately turn on based on the signals P0 to P3 from the page mode decoder PMD, and either of data DmW0 to DmW3 is selected and output through a turned-on transistor.

In the semiconductor memory device as constructed above, when a plurality of word data corresponding to one page is subjected to a time division operation to be continuously output, the data DmSn containing a defect is replaced with the replacement data RDATn based on the output bit position information RDm output from the redundant circuit RDNn, whereby a plurality of word data are reconfigured.

Hereinafter, a method for compensating for a defective bit will be described in detail.

In the semiconductor memory device, a plurality of memory cells storing one page of word data are simultaneously activated in accordance with the row addresses A7 to A19 and the column addresses A2 to A6, and these data are output from the sense amplifier SAn as the bit data DmSn. When a page address input from outside matches a defective page address stored in the replacement page address storage portion RA, the replacement bit storage portion RC outputs the output bit position information RDm, and the replacement cell data storage portion RB outputs the replacement data RDATn.

Next, the switch SWn replaces the output data DmSn of the sense amplifier SAn with the replacement data RDATn based on the output bit position information RDm from the redundant circuit RDNn. For example, in the case where a defective bit present in a memory cell array MA0 may cause a defect in the least significant bit of the first word data included in a page $P_h$, the switch SW0 receives the output bit position information RD0 of "1" from the redundant circuit RDN0, and replaces the data DmSn with a replacement data RDAT0 to output the replaced data.

As a result, the selector SEL receives data DOW0 in which the least significant bit of the first word of the page $P_h$ is reconfigured. Similarly, the bit data of the second word to the fourth word is reconfigured using the replacement data RDAT1 to RDAT3 based on output bit position information RD1 to RD3. Then, in accordance with the intra-page addresses A0 and A1, the obtained reconfigured data DOW0 to DOW3 is successively selected by the selector SEL to be continuously output as output data D0 through an output circuit B0. In this configuration, one bit can be replaced for each word. Any number of bits can be replaced for each word by being specified with the output bit position information RDm.

Figure 4:
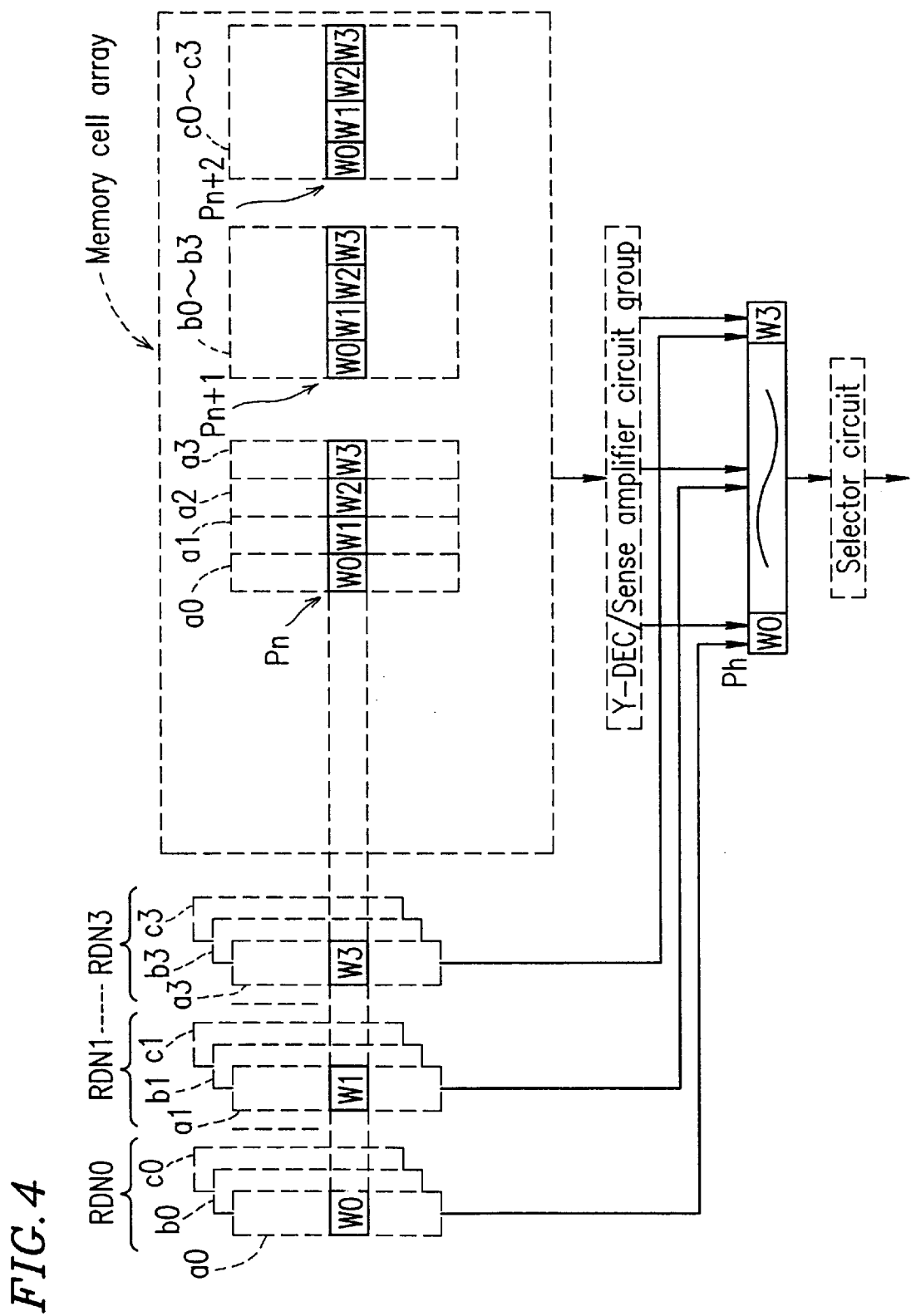
FIG. 4 is a diagram illustrating the relationship between the bank and the page.

Next, referring to FIG. 4, the relationship between the bank and the page will be described.

As described above, the bank refers to a group of data stored in the memory cells connected to the same sub-bit line, and the page refers to a group of data simultaneously read out from the memory cell arrays at one access using a page address. As shown in FIG. 4, for example, each of the word data W0 to W3 contained in the page $P_h$ in a memory cell array is divided into a plurality of banks a0 to a3 to be stored in each of the redundant circuits RDN0 to RDN3. Furthermore, a plurality of word data forming a different page are also present in each bank, and the redundant circuits RDN0 to RDN3 store the replacement data RDATn of the page $P_h$ on a bank basis.

In the above-mentioned redundant circuit RDNn shown in FIG. 1, one page of the replacement data is stored on a bank basis. Alternatively, for example, in the case where three (3) pages are to be replaced, the redundant circuits RDN0 to RDN3 may be adapted to store three (3) banks of data a0 to a3, b0 to b3, and c0 to c3, as shown in FIG. 4. The redundant circuit RDNn can be extended, if required.

Embodiment 2

A semiconductor memory device of the second embodiment according to the present invention will be described.

Figure 5:
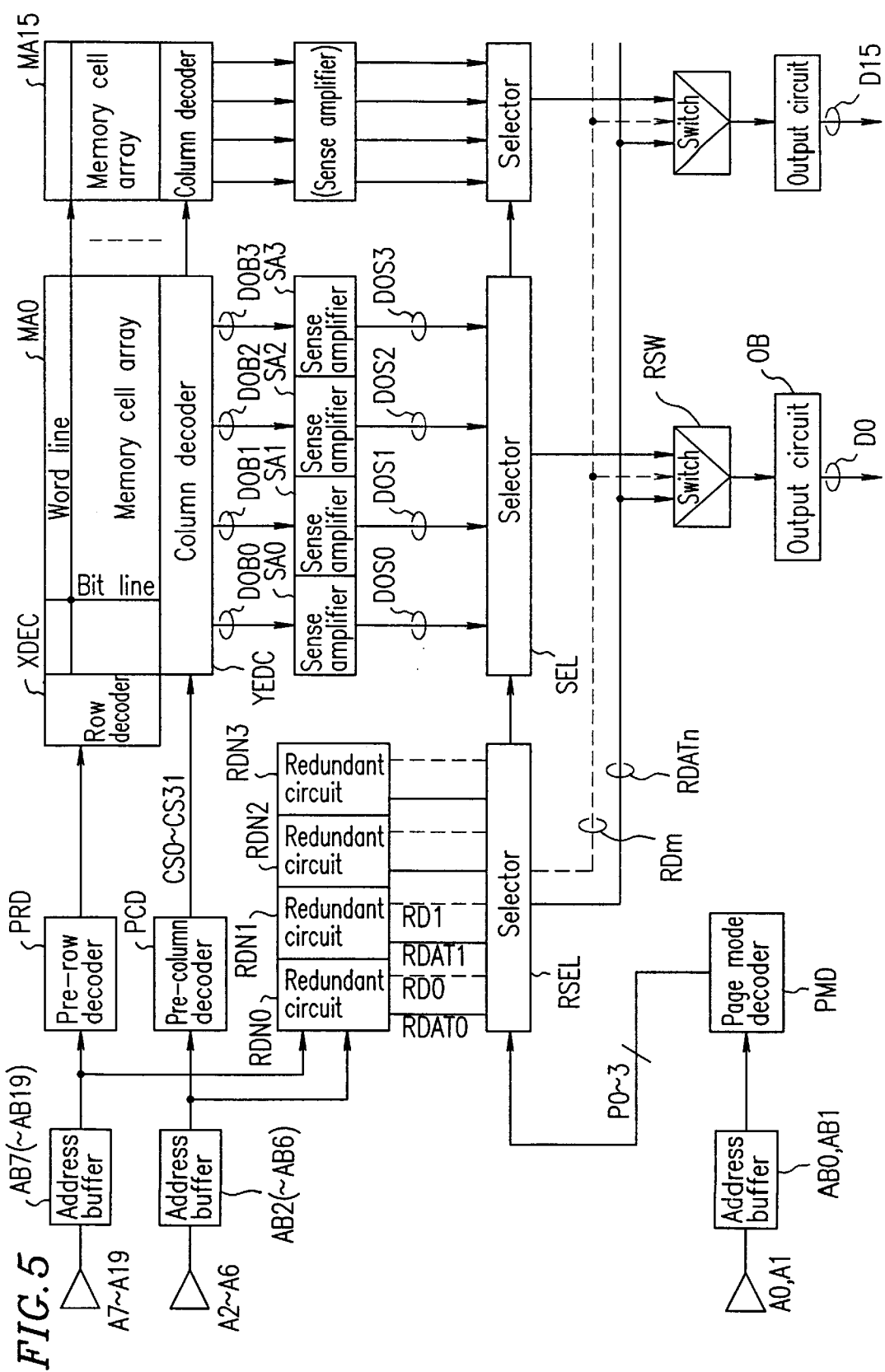
FIG. 5 is a block diagram of a semiconductor memory device of a second embodiment according to the present invention.

The previously-mentioned semiconductor memory device of the first embodiment shown in FIG. 1 includes the switches SW0 to SW3 for the respective sense amplifiers SA0 to SA3 which in turn correspond to a word, respectively. The outputs of these switches are selected in accordance with the intra-page addresses. On the other hand, the semiconductor memory device of the present embodiment as shown in FIG. 5 includes a selector RSEL and a switch RSW peculiar to the present embodiment, as well as the redundant circuits RDN0 to RDN3 shown in FIG. 1, in addition to the previously-mentioned structure shown in FIG. 9. Like components in FIG. 5 are designated by like reference signs in view of FIG. 1, and thus, the descriptions thereof are omitted here.

According to the present embodiment, the selector RSEL selects either of the redundant circuits RDN0 to RDN3 in accordance with intra-page addresses A0 and A1, and outputs the replacement data RDATn and the output bit position information RDm. The switch RSW replaces data DmSn which has been selected by the selector SEL with the replacement data RDATn based on output bit position information RDm which has been selected by the selector RSEL, whereby the data DmSn is reconfigured.

Figure 6:
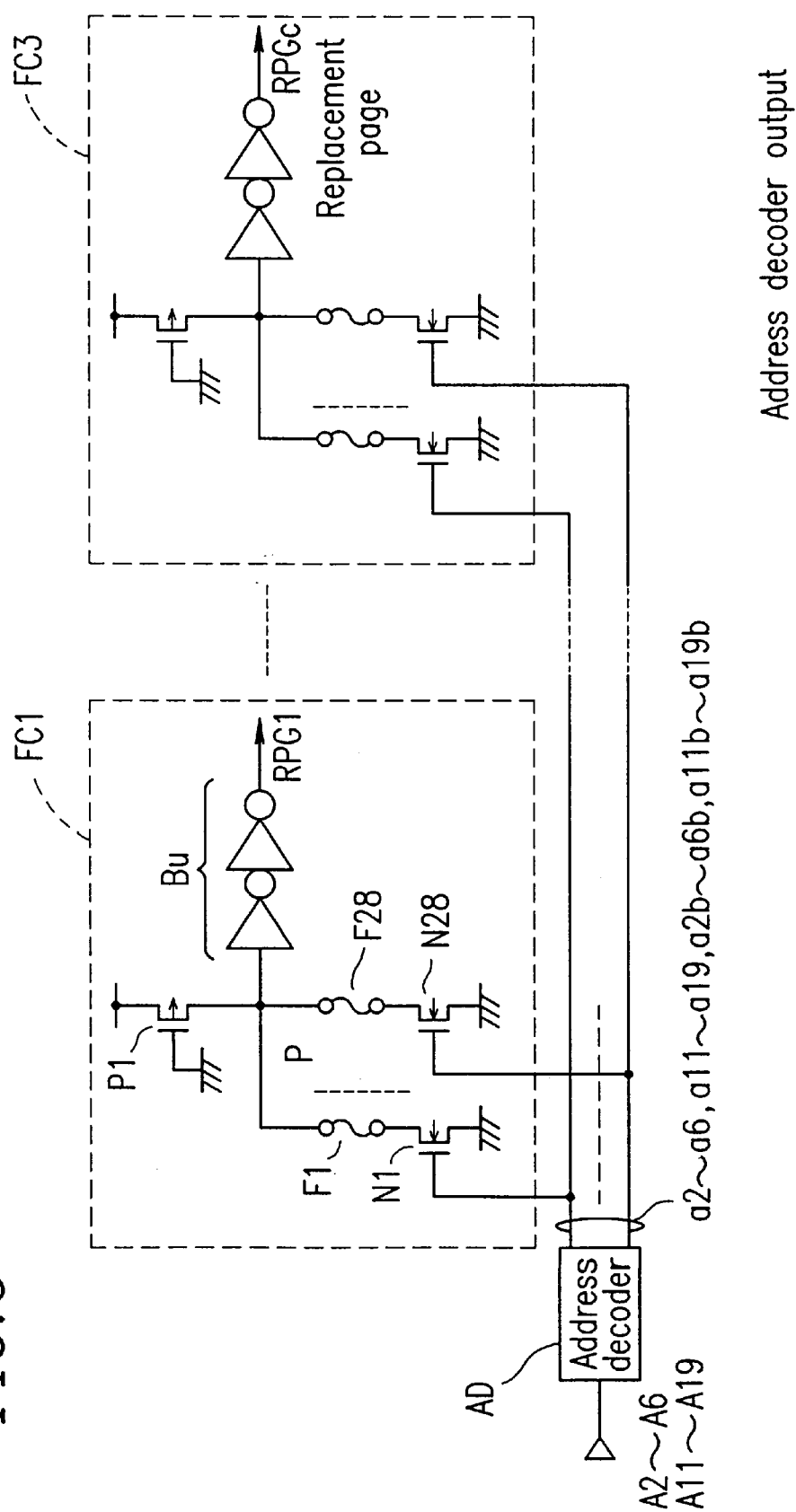
FIG. 6 is a circuit diagram of a replacement page address storage portion included in the redundant circuit of the semiconductor memory device according to the present invention.
Figure 7:
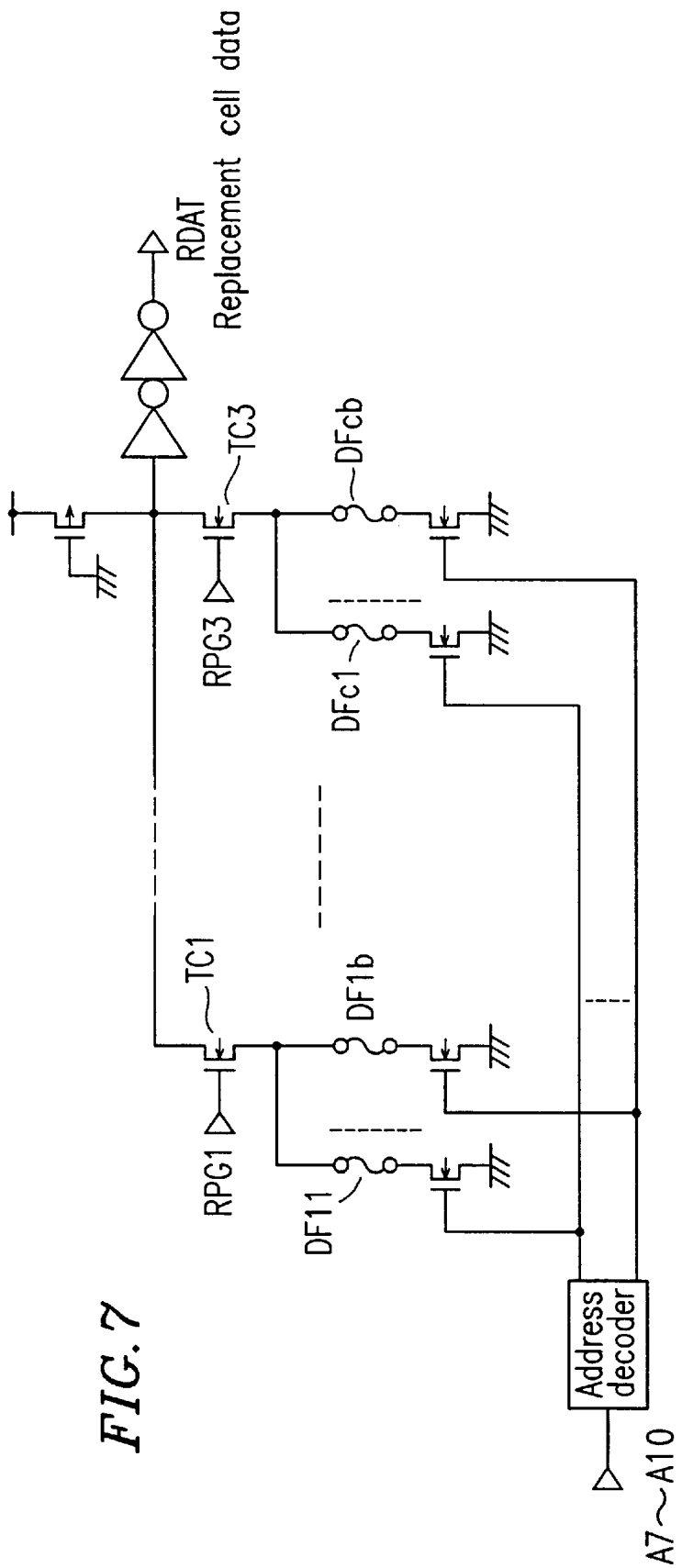
FIG. 7 is a circuit diagram of a replacement cell data storage portion included in the redundant circuit of the semiconductor memory device according to the present invention.
Figure 8:
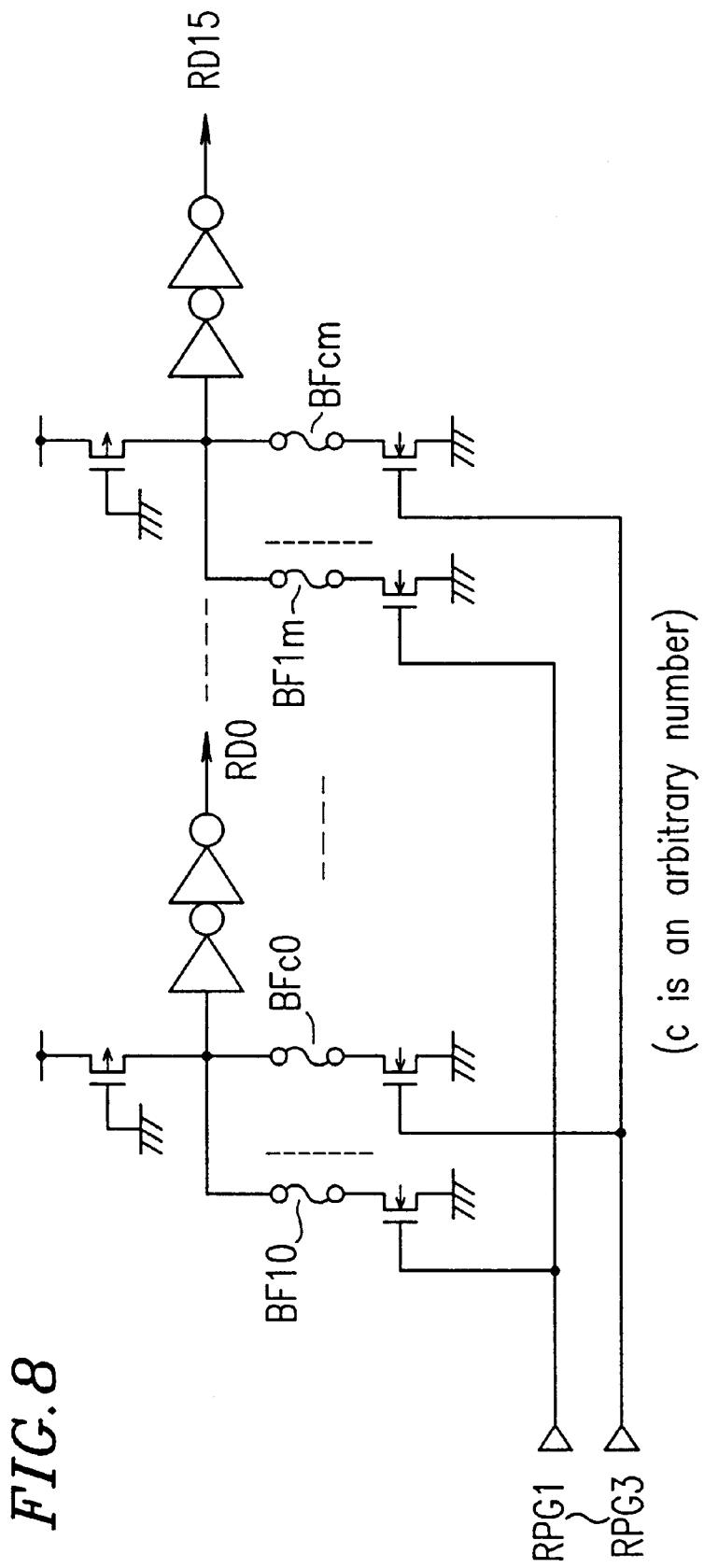
FIG. 8 is a circuit diagram of a replacement bit storage portion included in the redundant circuit of the semiconductor memory device according to the present invention.

FIGS. 6 to 8 respectively show exemplary circuits of a replacement page address storage portion RA, a replacement cell data storage portion RB, and a replacement bit storage portion RC, included in the redundant circuit RDNn of the first and second embodiments.

The replacement page address storage portion RA shown in FIG. 6 stores three pages of page addresses and detects the input of the page addresses. The replacement page address storage portion RA includes: an address decoder AD for generating signals a2 to a6 and a11 to a19 and signals a2b to a6b and a11b to a19b for the page addresses A2 to A6 and A11 to A19; and three fuse circuits FC1 to FC3 (the fuse circuit FC2 is omitted in FIG. 6). The signals a2 to a6 and a11 to a19 have a certain phase (referred to as the "positive-phase signals"), while the signals a2b to a6b and a11b to a19b have an inverted phase (referred to as the "inverted-phase signals") of the page addresses A2 to A6 and A11 to A19, respectively.

Each of the fuse circuits FC1 to FC3 includes: a P-type MOS transistor P1 as a load; 28 fuses F1 to F28 (each one end thereof being commonly connected to a drain of the transistor P1); N-type MOS transistors N1 to N28 connected between the respective other end of the fuses F1 to F28 and the ground; and a buffer Bu with an input thereof being connected to a connection point P between the P-type MOS transistor P1 and the fuses F1 to F28. Gates of the 28 transistors N1 to N28 receive the positive-phase signals and the inverted-phase signals derived from the 14 page addresses A2 to A6 and A11 to A19.

Next, the case is described where a defective page address (wherein the address A2 alone is "1", while the other addresses A3 to A6 and A11 to A19 are "0") on the first page is stored in the replacement page address storage portion RA having the above-mentioned structure, and the page address is detected.

In this case, a fuse connected to a transistor which receives the positive-phase signal a2 for the address A2 among the transistors N1 to N28 is disconnected by the laser light irradiation. Among the other fuses, the ones connected to the transistors which receive the inverted-phase addresses are also disconnected, while the remaining fuses are kept connected. Thus, a page address is programmed (stored). Due to the above programming, only when the address A2 alone becomes "1", all the transistors connected to the fuses which have not been disconnected turn off, and the electric potential of the connection point P is raised by the transistor P1. As a result of this, the buffer Bu outputs "1" as RPG1, and provides a notice of detection of the page address to the replacement bit storage portion RC and the replacement cell data storage portion RB in the subsequent stage. Similarly, the fuses of the fuse circuits FC2 and FC3 are selectively disconnected, whereby three (in total) pages of the page addresses are stored to be detected. The number of pages to be detected can be increased by appropriately increasing the fuse circuits FC1 (to FC3).

The replacement cell data storage portion RB shown in FIG. 7 programs data of the banks corresponding to the addresses A7 to A10, and stores them in fuses DF11 to DF1b. When the page of the specified bank is specified by page signals RPG1 to RPG3 from the replacement page address storage portion RA, either of transistors TC1 to TC3 turns on, and the data programmed with the fuses connected to the turned-on transistor is output as the replacement data RDAT.

Furthermore, the replacement bit storage portion RC shown in FIG. 8 programs three pages of replacement bits and stores them in fuses BF10 to BFcm and outputs replacement bit selection lines RD0 to RD15 on the page specified by the page signals RPG1 to RPG3 from the replacement page address storage portion RA. For example, in the case where the fuse BF10 is disconnected, when the replacement page specifying signal RPG1 is active, the replacement bit selection line RD0 specifying the least significant bit becomes active.

In the semiconductor memory device of the present embodiment, the redundant circuit with a structure for programming a replacement data, etc. in the fuses has a response speed higher than that of a memory cell. Therefore, the access time of the replacement data which is stored in the redundant circuit can be easily set to be shorter than that of a main memory at a time of a random access. Thus, the redundancy-related operations of the semiconductor memory device of this embodiment does not have any adverse effects on the random access time.

Furthermore, since the input of the selector SEL, which has already been determined, is selectively output in accordance with the intra-page address during a page access, any readout operation from a memory cell or any readout operation of the replacement data from the redundant circuit does not occur during the page access. Thus, the replacement operation of a defective bit by the redundant circuit has no adverse effects on the page access time.

The above-mentioned embodiments of the present invention have been described in detail, exemplifying a page mode. The present invention is also applicable to a semiconductor memory device adopting a method for continuously reading out data of a group of addresses as in a burst mode, a serial mode, etc.

As is apparent from the above description, the semiconductor memory device of the present invention has a structure in which data can be continuously accessed under the condition that the replacement data with respect to word data forming one page is determined. Therefore, data can be accessed without being adversely affected by the replacement (compensation) operation involving a redundant unit (circuits). Thus, the access time is not adversely affected by the replacement operation, and the production yield can be improved using the redundant unit (circuits).

Furthermore, the replacement can be conducted on the basis of a bank. Therefore, it is sufficient to provide a replacement data corresponding to a smallest unit of a memory cell group which will be affected by a defective bit. This enables the redundant circuit to be miniaturized, and makes it possible to conduct efficient replacement.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory device provided with a readout mode in which a plurality of word data are read out from a memory cell array as a group and are subjected to a time division operation to be continuously output, the device comprising:

a redundant unit which replaces a bit data of a defective bit present in the respective word data with a replacement data on a basis of the word data during said readout mode, thereby reconfiguring the plurality of word data; said readout mode being a page-mode in which a plurality of word data corresponding to one page is read out from the memory cell array; and a plurality of redundant circuits included as the redundant unit and provided so as to respectively correspond to the plurality of word data, for compensating for the defective bit present in the respective word data, each of the redundant circuits including:

a detection portion for storing page address information of the defective bit and detecting an access to a page on which the defective bit is present;

a bit information storage portion for storing output bit position information of the defective bit and outputting the stored output bit position information based on a detection result of the detection portion; and a replacement data storage portion for storing a replacement data and outputting the stored replacement data based on the detection result of the detection portion;

the bit data of the defective bit specified by the output bit position information being replaced with the replacement data during the page mode, thereby reconfiguring the plurality of word data.

2. A semiconductor memory device according to claim 1, further comprising:

a group of sense amplifiers for detecting respective bit data at the same bit position of the plurality of word data in a parallel manner; and a unit for replacing the bit data of the defective bit of the respective word data specified by the output bit position information with the replacement data in a parallel manner, thereby reconfiguring the plurality of word data and outputting the reconfigured word data to the group of sense amplifiers, the unit being provided in a preceding stage to the group of sense amplifiers.

3. A semiconductor memory device according to claim 1, further comprising:

a sense amplifier for time-dividing respective bit data at the same bit position of the plurality of word data and continuously detecting the bit data; and a unit for replacing the bit data of the defective bit of the word data specified by the output bit position information and intra-page address information, thereby reconfiguring the plurality of word data, the unit being provided in a subsequent stage to the sense amplifier.

4. A semiconductor memory device according to claim 1, wherein the replacement data storage portion stores the replacement data on a basis of bank data to be stored in a plurality of memory cells forming one bank.

* * * * *